United States Patent [19]

Crafts

[11] Patent Number: 5,257,162
[45] Date of Patent: Oct. 26, 1993

[54] BELLOWS LID FOR C4 FLIP-CHIP PACKAGE

[75] Inventor: Douglas Crafts, San Jose, Calif.
[73] Assignee: Intel Corporation, Santa Clara, Calif.
[21] Appl. No.: 979,636
[22] Filed: Nov. 20, 1992
[51] Int. Cl.⁵ .............................................. H05K 7/20
[52] U.S. Cl. .................................. 361/704; 165/80.3; 165/185; 174/16.3; 257/712; 257/718; 361/703
[58] Field of Search ................ 165/80.3, 80.4, 185; 174/16.3; 257/707, 712, 714, 718-719, 722, 726-727; 361/381-389, 408

[56] References Cited

U.S. PATENT DOCUMENTS 5,150,274 9/1992 Okada et al. ....................... 165/185

FOREIGN PATENT DOCUMENTS 63-4652 1/1988 Japan .................................. 361/386
208251 8/1988 Japan .................................. 361/386

Primary Examiner—Gregory D. Thompson
Attorney, Agent, or Firm—Blakely, Sokoloff, Taylor & Zafman

[57] ABSTRACT

An electronic package that has a lid that is in direct contact with an integrated circuit that is mounted to a substrate. The lid includes a plate portion that is in contact with the integrated circuit, an outer frame portion that is attached to the substrate, and a bellows portion that couples the plate portion to the outer frame portion.

8 Claims, 1 Drawing Sheet

BELLOWS LID FOR C4 FLIP-CHIP PACKAGE

BACKGROUND OF THE INVENTION

1. Field of the Invention

The present invention relates to an electronic package.

2. Description of Related Art

Present electronic packages typically contain an integrated circuit (IC) that is mounted to a ceramic substrate. The IC is encapsulated by a lid that is hermetically sealed to the substrate. Because of the tolerances in the individual components, the packages must be designed so that there exist a gap between the lid and the integrated circuit. To improve the thermal efficiency of the package, a thermal grease is typically inserted between the IC and the lid. The thermal grease provides a conductive path between the electrical device and the lid.

The application of thermal grease requires several process steps and must be contained while the lid is attached to the substrate. A misapplication of the thermal grease may cause some of the grease to flow in between the integrated circuit and the substrate. The existence of grease between these two members may degrade the performance of the chip.

Thermal grease also has a low temperature tolerance, such that only low temperature adhesives can be used to attach the lid to the substrate. It has been found that low temperature adhesives do not always provide a complete hermetical seal for the package. Additionally, thermal grease is a relatively poor thermal conductor, such that the package may produce unacceptable junction temperatures in the integrated circuit. It would therefore be desirable to have an electronic package that is thermally efficient and does not require thermal grease.

SUMMARY OF THE INVENTION

The present invention is an electronic package which has a lid that is in direct contact with an integrated circuit. The circuit is typically mounted to a substrate that is the lid in a manner that encapsulates the electrical device. The lid includes a plate portion that is in contact with the integrated circuit, an outer frame portion that is attached to the substrate, and a bellows portion that couples the plate portion to the outer frame portion. The bellows portion provides flexibility in the lid, so that the plate portion is always in contact with the integrated circuit, regardless of the tolerances in the assembly. The direct contact between the lid and the integrated circuit provides a continuous conductive thermal path that increases the overall thermal efficiency of the package.

The outer frame portion of the lid is typically soldered to the substrate to hermetically seal the electrical device. The lid is preferably attached to the substrate so that the plate portion applies a pressure to the integrated circuit. The plate pressure creates a pre-stress condition on the solder joints between the circuit and the substrate. Pre-stressing solder joints has been found to increase the fatigue life of the joints. The plate pressure also decreases the thermal resistance between the lid and the electrical device.

Therefore it is an object of the present invention to provide an electronic package that is thermally efficient and does not require the application of a thermal grease.

It is also an object of the present invention to provide a thermally efficient electronic package that applies a compressive pre-stress on the solder joints of the assembly.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
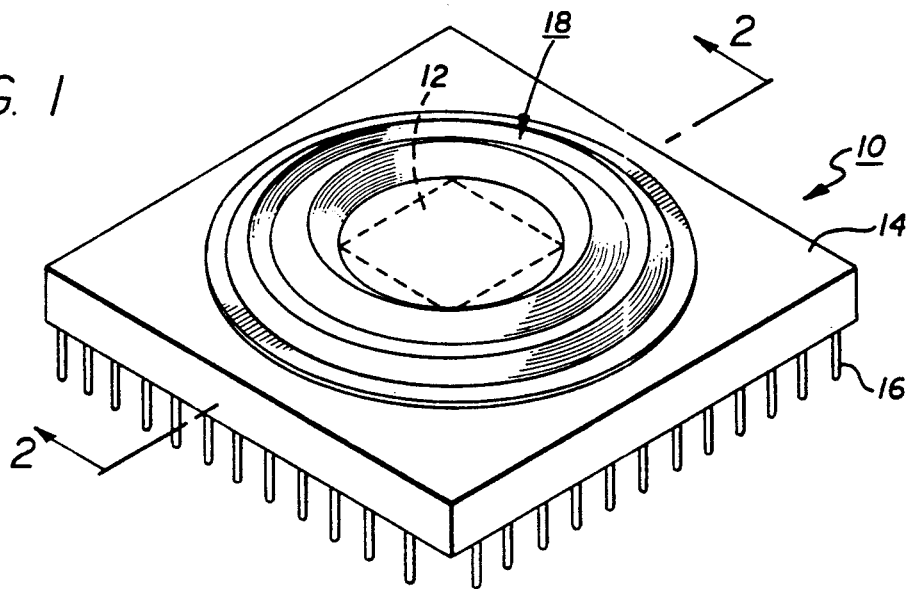
FIG. 1 is a perspective view of an electronic package of the present invention.
Figure 2:
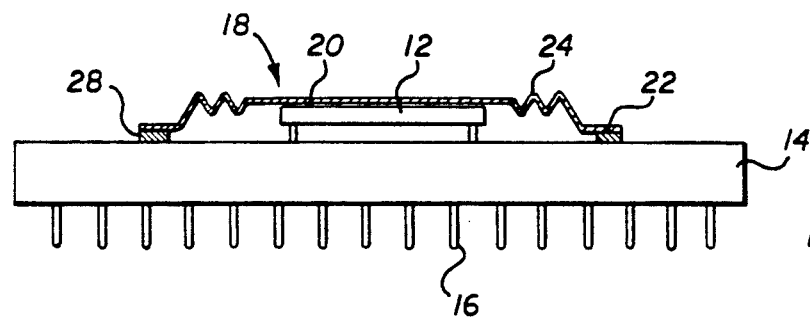
FIG. 2 is a cross-sectional view of the electronic package of FIG. 1.

Referring to the drawings more particularly by reference numbers, FIGS. 1 and 2 show an electronic package 10 of the present invention. The package 10 includes an electrical device 12 that is mounted to a substrate 14. The electrical device 12 is typically an integrated circuit which has a plurality of surface pads that are soldered to surface pads on the substrate 14. Although an integrated circuit is described, it is to be understood that the electrical device can be any type of electrical component. The substrate 14 is typically constructed from a ceramic material that contains conductive lines that couple the integrated circuit 12 to a plurality of pins 16 located on the bottom of the substrate 14. The pins 16 are typically soldered to a printed circuit board (not shown) as is known in the art.

The electrical device 12 is encapsulated by a lid 18 that is attached to the substrate 14. The lid 18 has a plate portion 20 that is adjacent to a bottom surface of the device 12, an outer frame portion 22 that is attached to the substrate 14 and a bellows portion 24 that couples the plate portion 20 to the outer frame portion 22. The lid 18 is typically constructed from a thermally conductive material such as aluminum. The plate 20 and frame 22 portions are constructed to be flat and rigid. The bellows portion 24 is constructed to be flexible.

The lid 18 can be constructed from a single sheet of aluminum, wherein the bellows portion 24 is formed by stretching and crimping the material. Although creating the lid 18 from a single sheet is described, it to be understood that the lid 18 can be constructed from multiple pieces, which may or may not be formed from the same material. Additionally, although a flat outer frame portion 22 is shown and described, it is to be understood that the bellows portion 24 could be attached directly to the substrate 14.

Figure 3:
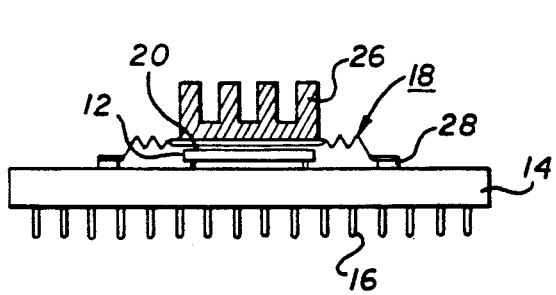
FIG. 3 is a cross-sectional view of an alternate embodiment of the electronic package of FIG. 1.

The lid 18 is attached to the substrate 14 so that the plate portion 20 is always contiguous with the electrical device 12. The direct contact between the plate portion 20 and the integrated circuit 12 reduces the thermal resistance between the two members and the junction temperatures of the circuit 12. As shown in FIG. 3, the lid 18 may have a plurality of fins 26 that improve the overall thermal efficiency of the lid 18. The fins 26 may be soldered or brazed to the plate portion 20 to decrease the thermal resistance of the thermal interface between the heat sink 26 and the lid 18.

The outer frame portion 22 may be attached to the substrate 14 by a solder 28. The circuit 12 is typically hermetically sealed in an inert gas by the lid 18, the substrate 14 and the solder 28. Although a solder 28 is described and shown, it is to be understood that the lid 18 may be attached to the substrate 14 by gold or an adhesive such as an epoxy.

The lid 18 is preferably constructed so that the plate portion 20 applies a pressure to the electrical device 12 to insure that the device 12 is always in contact with the lid 18. The lid pressure also provides a compressive pre-stress on the solder joints between the integrated circuit 12 and the substrate 14. Compressive pre-stresses have been found to increase the fatigue life of the solder joints. The lid pressure also reduces the thermal resistance between the plate portion 20 and the device 12.

The bellows portion 24 is typically constructed to be rigid enough to apply a pressure to the electrical device 12, yet flexible enough to compensate for tolerances in the assembly 10. For example, if the components 12, 14 and 18 are oversized, the bellows portion 24 will expand during assembly to insure contact between the lid 18 and the device 12. In the preferred embodiment, the lid 18 is constructed so that the bellows portion 24 expands during the assembly of every package 10. Such expansion insures that the plate portion 20 is always in contact with the electrical device 12 regardless of the component tolerances. The bellows portion 24 also compensates for any unequal thermal expansion between the lid 18 and the substrate 14, that may result when the members have different coefficient of thermal expansions. Compensating for the different thermal expansion rates, reduces the stresses in the solder 28 and improves the overall life of the package 10.

Figure 4:
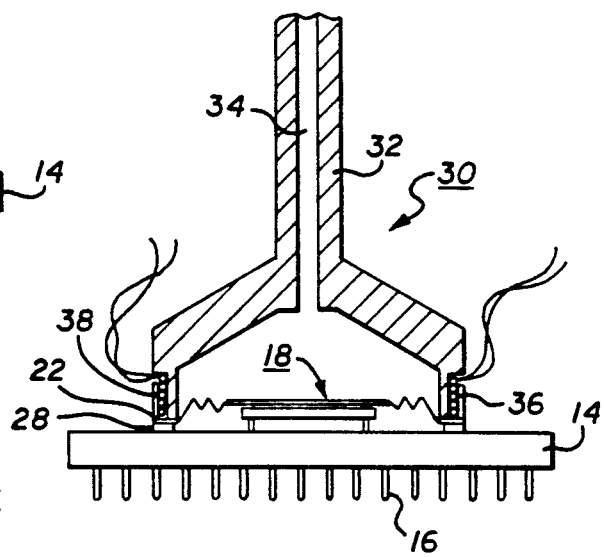
FIG. 4 is a cross-sectional view of the electronic package being sealed with a vacuum collet that has a heating element.

FIG. 4 shows a preferred method of attaching the lid 18 to the substrate 14. A solder paste 28 is initially applied to the substrate 14 by a template (not shown). The lid 18 is held by a vacuum collet 30. The collet 30 includes a housing 32 with a passage 34 that is coupled to a vacuum source (not shown) such as a compressor. The vacuum source creates a vacuum between the housing 32 and the lid 18 to hold the lid 18 in place.

The lid 18 is placed onto the substrate 14 so that the outer frame portion 22 is adjacent to the solder paste 28. The outer frame portion 22 is also adjacent to an annular arm 36 which contains a heating element 38. The heating element 38 provides a local supply of heat to the outer frame portion 22, to elevate the temperature of the solder paste 28. The heating element is held in place until the solder paste liquefies. After a predetermined amount of time, the vacuum between the lid 18 and housing 32 is released and the collet 30 is removed from the package 10. The same process can be used when gold or an adhesive is used to attach the lid 18 to the substrate 14. As an alternate method the entire package may be heated to reflow the solder, etc.

Although the lid 18 is described and shown as being attached to a substrate 14, it is to be understood that the electrical device 12 and the lid 18 could be coupled directly to a printed circuit board. The collet 30 could then be part of a pick and place machine that attaches the lids 18 to the board in accordance with a predetermined program.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:
   a substrate;
   an electrical device coupled to said substrate; and,
   a lid that has a plate portion contiguous with said electrical device, an outer frame portion attached to said substrate and a bellows portion coupled to said outer frame portion and said plate portion, said lid being attached to said substrate so that said plate portion applies a pressure to said electrical device, said bellows portion extending between said plate portion and said outer frame portion in both an axial and longitudinal direction relative to said substrate.

2. The package as recited in claim 1, wherein said outer frame portion is attached to said substrate by solder.

3. The package as recited in claim 1, wherein said lid includes a plurality of fins extending form said plate portion.

4. The package as recited in claim 1, wherein said lid is constructed from aluminum.

5. The package as recited in claim 1, wherein said outer frame portion is attached to said substrate by epoxy.

6. The package as recited in claim 1, wherein said outer frame portion is attached to said substrate by gold.

7. A method for assembling an electronic package, comprising the steps of;
   a) providing an electrical device that is mounted to a substrate;
   b) placing a lid adjacent to said electrical device so that a plate portion of said lid is contiguous with said electrical device and an outer frame portion of said lid is adjacent to said substrate, said plate portion being separated from said outer frame portion by a bellows portion which extends in both an axial and longitudinal direction relative to said substrate; and,
   c) coupling said outer frame portion to said substrate.

8. The method as recited in claim 7, wherein said lid is attached to said substrate by heating said lid and said substrate.

* * * * *